United States Patent
Park et al.

[11] Patent Number: 5,962,185
[45] Date of Patent: *Oct. 5, 1999

[54] POLYMER FOR POSITIVE PHOTORESIST AND CHEMICAL AMPLIFIED POSITIVE PHOTORESIST COMPOSITION CONTAINING THE SAME

[75] Inventors: Joo-Hyeon Park; Seong-Ju Kim; Ji-Hong Kim; Ki-Dae Kim, all of Taejeon, Rep. of Korea

[73] Assignee: Korea Kumho Petrochemical Co., Ltd., Seoul, Rep. of Korea

[ * ] Notice: This patent is subject to a terminal disclaimer.

[21] Appl. No.: 08/938,925

[22] Filed: Sep. 26, 1997

[30] Foreign Application Priority Data

Sep. 21, 1996 [KR] Rep. of Korea .............. 96-41437

[51] Int. Cl.$^6$ ................................. G03F 7/004
[52] U.S. Cl. ............. 430/270.1; 430/170; 430/905; 430/910; 526/314; 526/318.41; 526/326
[58] Field of Search ................ 430/270.1, 170, 430/910, 905; 526/314, 318.41, 326

[56] References Cited

U.S. PATENT DOCUMENTS

| | | | |
|---|---|---|---|
| 4,876,173 | 10/1989 | Maemoto et al. | 430/271.1 |
| 4,925,768 | 5/1990 | Iwasaki et al. | 430/271.1 |
| 5,070,001 | 12/1991 | Stahlhofen | 430/270.1 |
| 5,558,978 | 9/1996 | Schadeli et al. | 430/270.1 |
| 5,705,570 | 1/1998 | Burns et al. | 430/270.1 |

*Primary Examiner*—John S. Chu
*Attorney, Agent, or Firm*—Harrison & Egbert

[57] ABSTRACT

A positive chemical amplified photoresist composition having as a matrix resin a polymer having the repeating unit of Formula (I) and a photoacid generator. The polymer ranges, in polystyrene-reduced weight average molecular weight, from about 2,000 to 1,000,000. The photoresist composition is possible to develop in alkali and shows excellent sensitivity, resolution and transmissivity to deep uv light in addition to being superior in storage preservativity. The repeating unit of Formula (I) is:

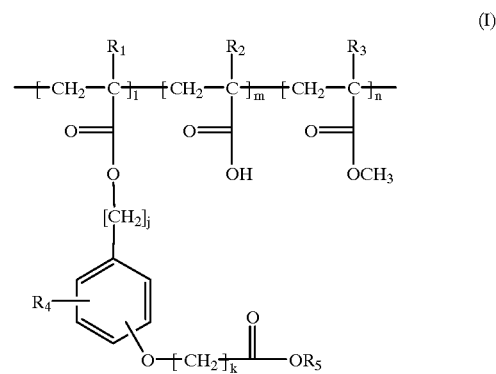

wherein, $R_2$, $R_2$ and $R_3$ are independently represented by a hydrogen atom or a methyl group; $R_4$ is a hydrogen atom, an alkyl group or an alkoxy group; $R_5$ is functions as an acid-labile protective group and is selected from a t-butyl group, a tetrahydropyranyl group or an alkoxymethylene group; j is an integer of 1–8; k is an integer of 0–8; and l, m and n each represent a mole ratio, satisfying the condition of l+m+n=1 where 0<l<0.4.

4 Claims, No Drawings

POLYMER FOR POSITIVE PHOTORESIST AND CHEMICAL AMPLIFIED POSITIVE PHOTORESIST COMPOSITION CONTAINING THE SAME

BACKGROUND OF THE INVENTION

1. Field of the Invention

The present invention relates to a polymer useful for positive photoresist and a positive photoresist composition containing the same.

2. Description of the Prior Art

The high integration of semiconductor devices has always been followed by significant advance in lithography. For example, ultra-fine patterns as small as sub-microns or quarter-microns in size must be required for the fabrication of ultra-LSI. Accordingly, as the light sources used to form the fine patterns become shorter in wavelength from g-line to i-line and deep uv light, further to excimer laser, such as a KrF laser, and finally to electron beams, the development of the compositions corresponding to the light sources are essential for the lithography.

Since the photoresists prepared from novolak-quinone diazides, materials used for g-line or i-line, show large absorption at the wavelength range of deep uv light and excimer laser, a fine pattern cannot be obtained from the photoresists. Thus, there was a strong demand for a material that little absorbs the light belonging to such wavelength ranges. In response to the demand, active research has been directed to the development of chemical amplified photoresists based on polyhydroxystyrene derivatives which are smaller in absorption at 248 nm than novolak-quinonediazides.

Chemical amplified photoresists are characterized in that they show high sensitivity and resolution and the physical properties of their matrix resins are changed by a catalytic amount of the acid which is generated upon radiation. For example, a photoresist prepared from a matrix resin in which the hydroxy groups of polyhydroxystyrene are partly replaced with t-butylcarboxy groups and an onium salt, a compound which generates acid upon radiation (hereinafter referred to as "photoacid generator"), is disclosed in U.S. Pat. No. 4,491,628. Another example is a resist employing a copolymer of 4-hydroxystyrene and t-butylacrylate as a matrix resin and a sulfonate compound as a photoacid generator, as disclosed in J. Photopol. Scien. and Tech., 9, 557–572, 1996. However, these conventional resists are thermally instable and their polymers are difficult to synthesize. Further, in the case of the polyhydroxystyrene, it may be oxidized into quinone compounds, which absorb much light at 248 nm.

SUMMARY OF THE INVENTION

Having tried to solve the above problems encountered in prior arts through intensive and thorough experiments, the present inventors developed a novel photoresist polymer at last, which is easy to synthesize and affords its photoresist physical properties suitable for the high integration of semiconductor devices.

Therefore, it is an object of the present invention to provide a positive photoresist polymer which is sensitive to various radiations and shows no significant absorption peaks at 248 nm.

It is another object of the present invention to provide a positive photoresist composition which is superior in thermal stability, adhesiveness to substrate and storage stability and can form itself into a resist pattern with an excellent profile.

In accordance with an aspect of the present invention, there is provided a copolymer having the repeating unit represented by the following formula (I):

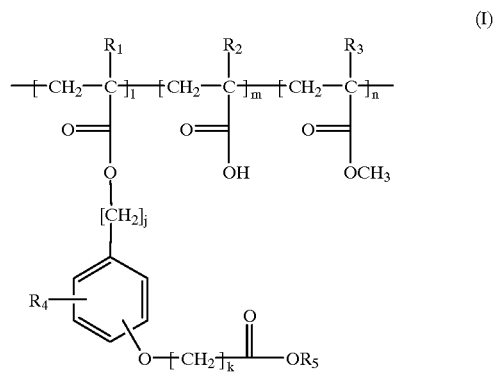

wherein, $R_1$, $R_2$ and $R_3$ are independently represented by a hydrogen atom or a methyl group; $R_4$ is a hydrogen atom, an alkyl group or an alkoxy group; $R_5$ functions as an acid-labile protective group and is selected from a t-butyl group, a tetrahydropyranyl group or an alkoxymethylene group; j is an integer of 1–8; k is an integer of 0–8; and l, m and n each represent a mole ratio, satisfying the condition of l+m+n=1 where 0<l<0.4.

In accordance with another object of the present invention, there is provided a positive photoresist composition containing the copolymer of formula as a matrix resin.

DETAILED DESCRIPTION OF THE INVENTION

The polymer of Formula (I) can be obtained by polymerizing monomers, represented by the following formulas (II), (III) and (IV):

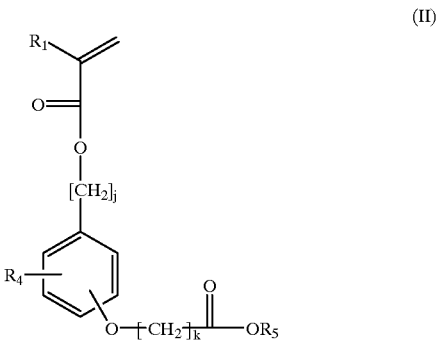

wherein $R_1$, $R_2$ and $R_3$ are independently represented by a hydrogen atom or a methyl group; $R_4$ is a hydrogen atom, an alkyl group or an alkoxy group; $R_5$ functions as an acid-labile protective group and is selected from a t-butyl group, a tetrahydropyranyl group or an alkoxymethylene group; j is an integer of 1–8; and k is an integer of 0–8.

In accordance with the present invention, the monomer of Formula (II) may be polymerized with the acrylic acid or methacrylic acid of Formula (III) and/or the methyl acrylate or methyl methacrylate of Formula (IV), to produce a copolymer or a terpolymer. Alternatively, the monomer of Formula (II) may be polymerized alone, to produce a homopolymer. Either of the cases is in the scope of the present invention. The copolymer or terpolymer may belong to a type of a block polymer, a random polymer or a graft polymer.

The polymer of Formula (I) may be obtained through various techniques, including radical polymerization, anion polymerization and living anion polymerization. Of them radical polymerization is more preferred. This reaction may be carried out in a manner of mass polymerization, solution polymerization, suspension polymerization, mass-suspension polymerization, or emulsion polymerization. When the polymer is synthesized through a radical polymerization technique, the reaction solvent is selected from benzene, toluene, xylene, halobenzene, diethylether, tetrahydrofuran, esters, lactones, ketones, amides and the mixtures thereof.

The radical polymerization starts by the action of a radical polymerization initiator. Common radical polymerization initiators may be used. The examples of the initiator, not limitative but illustrative, include azobisisobutyronitrile, benzoylperoxide, laurylperoxide, azobisisocapronitrile, and azobisisovaleronitrile.

When the monomers of Formula (II) are polymerized alone, the resulting homopolymer has a disadvantage of low glass transition temperature. To overcome this disadvantage, the acrylic acid or methacrylic acid of Formula (III) participates in the polymerization. The acrylic acid or methacrylic acid moiety of the resulting copolymer plays a role of increasing the glass transition temperature as well as making strong the adhesiveness to semiconductor substrate. Further, to enhance the adhesiveness to semiconductor substrate, the methyl acrylate or methyl methacrylate of Formula (IV) is added upon the polymerization. That is, a terpolymer of the monomers of Formulas (II), (III) and (IV) is high in glass transition temperature, showing strong adhesiveness to semiconductor substrate.

Depending on the polymerization catalyst (initiator), the selection of a polymerization temperature is left open. For example, when the radical polymerization is carried out in the presence of azobisisobutyronitrile, the reaction temperature preferably ranges from 60° C. to 90° C.

As for the molecular weight of the polymer produced, it can be controlled by adjusting the amount of polymerization catalyst and the reaction time. In accordance with the present invention, the polymer ranges, in polystyrene-reduced weight average molecular weight, from about 1,000 to 1,000,000, and preferably from about 4,000 to 70,000 when considering the properties for a photoresist to have, such as, sensitivity, resolution, developing property, coatability, and thermal resistance. For example, if the molecular weight is lower than 4,000, the resulting photoresist is poor in coatability and thermal resistance. On the other hand, if the molecular weight is over 70,000, the other properties, that is, sensitivity, resolution and developing property, become inferior. It is preferred that the polymer has a molecular distribution (Mw/Mn) ranging from 1 to 5 and more preferably 1.2 to 2.5.

After the completion of the polymerization, un-reacted monomer residues must be at an amount of 10 weight % or less based on the weight of the polymer produced and preferably 3 weight % or less. When the un-reacted monomers are over 3 weight %, they are preferably removed by, for example, distillation in vacuo or precipitation in solvent. In the precipitation in solvent, the reactant mixture containing the polymer produced is dissolved in a small amount of a solvent which has a large solubility to the polymer and then, this solution is slowly added in an excess amount of a solvent which has a small solubility to the polymer, to precipitate the polymer. This precipitate is filtered and dried.

As described above, the positive photoresist composition of the present invention comprises a photoacid generator. It may be selected from onium salts including iodonium salts, sulfonium salts, phosphonium salts, diazonium salts and pyridium salts. More preferable examples of photoacid generator include triphenylsulfonium triflate, diphenyl(4-methylphenyl)sulfonium triflate, diphenyl(4-t-butylphenyl) sulfonium triflate, diphenyl(4-methoxyphenyl)sulfonium triflate, triphenylsulfonium hexafluoroantimonate, diphenyliodonium triflate, diphenyliodonium methylbenzenesulfonate, bis(cyclohexylsulfonyl) diazomethane and bis(2,4-dimethylphenyl sulfonyl) diazomethane. The photoacid generator also can be selected from halogen compounds including 1,1-bis(4-chlorophenyl)-2,2,2-trichloroethane, phenyl-bis (trichloromethyl)-s-triazine, and naphthyl-bis (trichloromethyl)-s-triazine. Further, diazoketone compounds, such as 1,3-diketo-2-diazo compounds, diazobenzoquinone compounds and diazonaphthoquinone compounds, sulfone compounds, sulfonic acid compounds, and nitrobenzyl compounds can be used as the photoacid generator. Of them onium compounds and diazoketone compounds are preferable. Based on 100 weight parts of the total solid content of the composition, the photoacid generator is used at an amount of 0.1–30 weight parts and preferably 0.3–10 weight parts. The photoacid generators exemplified may be used alone or in combination with two or more species.

The photoresist composition of the present invention, if necessary, may comprise an acid-decomposable compound which promotes the dissolution of the composition in a developing solution. Preferred are the aromatic polyhydroxy compounds protected by t-butoxycarboxy group. They may be used alone or in combination and are added to the composition at an amount of 5–80 weight parts per 100 weight parts of the total solid content of the composition and preferably 10–50 weight parts.

In addition, if necessary, the photoresist composition of the present invention may be added with additives, including surfactant, azo compounds, halation inhibitor, adhesive aid, preservative, anti-foaming agent, etc. Examples of surfactant include polyoxylaurylether, polyoxyethylene stearylether, polyoxyethylene oleylether, polyoxyethylene octylphenolether, polyoxyethylenonyl phenolether, and polyethyleneglycol dilaurate. It is preferably used at an amount of 2 weight parts or less based on 100 weight parts of the total solid content of the photoresist composition.

If there is a need for the improvement in sensitivity or resolution, a light absorbent may be used. For this purpose, benzophenones or naphthoquinones are added in the composition of the present invention at an amount of 0.2–30 weight % based on the total solid content and preferably 0.5–10 weight %.

To obtain a uniform and smooth coat, a solvent for the photoresist composition should have appropriate volatility and viscosity. The solvents showing such physical properties include ethyleneglycol monomethylether, ethyleneglycol monoethylether, ethyleneglycol monopropylether, ethlyeneglycol monobutylether, diethyleneglycol dimethylether, diethyleneglycol diethylether, diethyleneglycol dipropylether, diethyleneglycol dibutylether, methylcellosolveacetate, ethylcellosolveacetate, propyleneglycol monomethylether acetate, propyleneglycol monoethylether acetate, propyleneglycol monopropylether acetate, methylethylketone, cyclohexanone, methyl 2-hydroxypropionate, ethyl 2-hydroxypropionate, 2-heptanone, N-methylpyrrolidone, N,N-dimethylformamide, N,N-dimethylacetamide, ethylpyruvate, n-amylacetate, ethyl lactate, and gamma-butyrolacetone and, if necessary, may be used alone or in combination. As for the amount of solvent, it is dependent on the physical properties, that is, volatility and viscosity may be controlled in such a way that the composition be uniformly coated on a wafer.

A photoresist coat is obtained by coating the photoresist solution on a wafer and drying it. Spin coating, flow coating or roll coating techniques may be used.

For the formation of fine pattern, only part of the resist film coated in such a method as exemplified above, should be exposed to radiation. Depending on the photoacid generator, the resist film can he exposed to a light source including, for example, i-line (a uv light), excimer laser (a deep uv light), an X-ray, and an electron beam (a charged particle ray). After being radiated, the film, if necessary, may be subjected to thermal treatment in order to enhance apparent sensitivity.

A developing solution useful for the radiated film is selected from aqueous solutions containing sodium hydroxide, potassium hydroxide, sodium carbonate, sodium silicate, sodium methasilicate, ammonia water, ethyl amine, n-propylamine, triethylamine, tetraethylammonium hydroxide or tetraethylammonium hydroxide with preference to tetramethylammonium hydroxide. To the developing solution, surfactants and/or aqueous alcohols may be added. In this case, a washing process with water preferably follows the developing process.

Consequently, the positive photoresist according to the present invention is suitable for any radiation, including, for example, i-line (uv light), excimer laser (deep uv light), X-ray and electron beam (charged particle ray), as well as being superior in preservativity, resolution and patterning so that it can he useful for the fabrication of semiconductor devices.

A better understanding of the present invention may be obtained in light of following examples which are set forth to illustrate, but are not to be construed to limit, the present invention.

SYNTHESIS EXAMPLE I 0.04 mole (5.5 g) of 2-(4-hydroxyphenyl)ethanol, 0.05 mole (6.0 g) of potassium carbonate and 0.01 mole (1.3 g) of potassium iodide were dissolved in 150 ml of acetonitrile in a 300 ml four-neck flask. Meanwhile, 0.04 mole (8.6 g) of t-butyl bromoacetate was dropwise added with stirring in the flask. After the completion of the addition, the solution was reacted at 80° C. for 20 hours. After the solvent was removed, the reaction mixture was diluted with ethyl acetate, washed with 5% NaOH aqueous solution and then, with distilled water, and dried, to produce an intermediate, represented by the following formula (II-1').

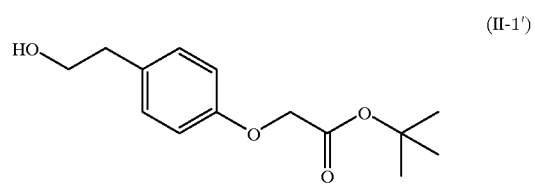

(II-1')

This intermediate product was used without further purification. The intermediate product (II-1') was dissolved in 200 ml of dichloromethane, added with 0.05 mole (4.3 g) of methacryloyl chloride, all cooled to 0° C. and then dropwise added with 0.06 mole (6.37 g) of triethyl amine, the solution was stirred at room temperature for 4 hours and washed 2–3 time with a saturated sodium chloride solution. The organic phase thus separated was dried over anhydrous magnesium sulfate, filtered and completely deprived or the solvent, methylene chloride. Purification with silica gel column chromatography yielded 7.5 g of a monomer (II-1):

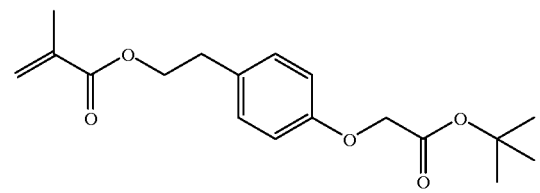

(II-1)

SYNTHESIS EXAMPLE II

An intermediate product (II-2') was obtained in a similar manner to that of Synthesis Example I except for using 0.04 mole (4.9 g) of 4-hydroxybenzyl alcohol instead of 2-(4-hydroxyphenyl)ethanol. The intermediate product was reacted with methacryloyl chloride, to yield 6.8 g of a monomer (II-2).

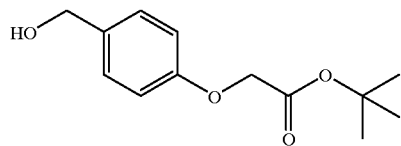

(II-2')

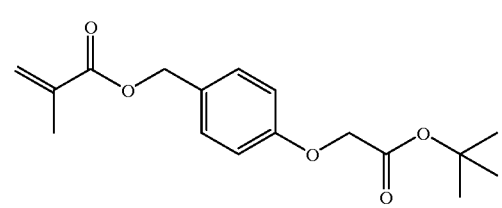

(II-2)

SYNTHESIS EXAMPLE III

An intermediate product (II-3') was obtained in a similar manner to that of Synthesis Example I except for using 0.04 mole (6.2 g) of 4-hydroxy-3-methoxybenzyl alcohol instead of 2-(4-hydroxyphenyl)ethanol. The intermediate product was reacted with methacryloyl chloride, to yield (8.2 g of a monomer (II-3).

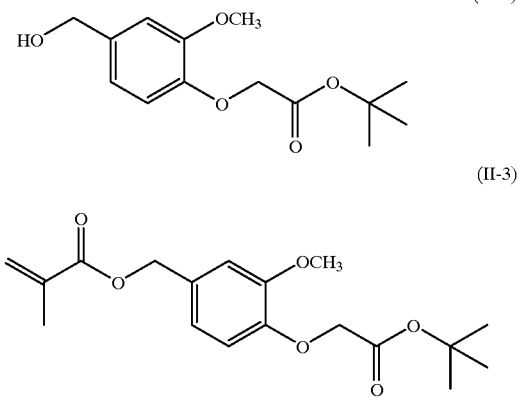

(II-3')

(II-3)

SYNTHESIS EXAMPLE IV 9.8 g of the monomer (II-1) obtained in Synthesis Example I was dissolve in 17.3 g of toluene in a 100 ml reactor and AIBN (2,2'-azo-bisisobutyronitrile), acting as polymerization initiator, was added at a concentration of 0.01 mol/l. At room temperature, the reactor was charged with nitrogen for 3 hours and then, at 70° C., the mixture was subjected to reaction for 2 hours with stirring. After the completion of this polymerization, 10 ml of dichloromethane was poured to the reaction mixture to dissolve the polymer produced. Thereafter, the resulting solution was drop wise added in 1,000 ml of hexane, to give while precipitates which were, then, filtered and dried in vacuo for 20 hours, to yield 5.0 g of Resin (I). It had a polystyrene-reduced weight average molecular weight (hereinafter weight average molecular weight) of about 45,000.

SYNTHESIS EXAMPLE V

Using 8.0 g of the monomer (II-2) obtained in Synthesis Example II, the procedure of Synthesis Example IV was repeated to produce 4.8 g of Resin (II). It was found to be about 42,000 in weight average molecular weight.

SYNTHESIS EXAMPLE VI

Using 8.0 g of the monomer (II-3) obtained in Synthesis Example III, the procedure of Synthesis Example IV was repeated to produce 4.5 g of Resin (III). It was found to be about 39,000 in weight average molecular weight.

SYNTHESIS EXAMPLE VII

Using 9.8 g of the monomer (II-1) obtained in Synthesis Example I and 0.6 g of acrylic acid, the procedure of Synthesis Example IV was repeated to produce 5.2 g of Resin (IV). It was found to be about 37,000 in weight average molecular weight.

SYNTHESIS EXAMPLE VIII

Using 9.8 g of the monomer (II-2) obtained in Synthesis Example II and 0.6 g of acrylic acid, the procedure of Synthesis Example IV was repeated to produce 5.1 g of Resin (V). It was found to be about 48,000 in weight average molecular weight.

SYNTHESIS EXAMPLE IX

Using 9.8 g of the monomer (II-3) obtained in Synthesis Example III and 0.6 g of acrylic acid, the procedure of Synthesis Example IV was repeated to produce 4.9 g of Resin (VI). It was found to be about 39,000 in weight average molecular weight.

SYNTHESIS EXAMPLE X

Using 9.8 g of the monomer (II-1) obtained in Synthesis Example I, the procedure of Synthesis Example IV was repeated to produce 5.2 g of Resin (VII). It was found to be about 35,000 in weight average molecular weight.

SYNTHESIS EXAMPLE XI

Using 9.8 g of the monomer (II-2) obtained in Synthesis Example II and 0.7 g of methacrylic acid, the procedure of Synthesis Example IV was repeated to produce 5.8 g of Resin (VIII). It was found to be about 31,000 in weight average molecular weight.

SYNTHESIS EXAMPLE XII

Using 9.8 g of the monomer (II-3) obtained in Synthesis Example III and 0.7 g of methacrylic acid, the procedure of Synthesis Example IV was repeated to produce 4.5 g of Resin (IX). It was found to be about 29,000 in weight average molecular weight.

SYNTHESIS EXAMPLE XIII

Using 9.8 g of the monomer (II-1) obtained in Synthesis Example I and 0.3 g of methacrylic acid, the procedure of Synthesis Example IV was repeated to produce 5.9 g of Resin (X). It was found to be about 26,000 in weight average molecular weight.

SYNTHESIS EXAMPLE XIV

Using 9.8 g of the monomer (II-1) obtained in Synthesis Example XI and 0.2 g of methacrylic acid, the procedure of Synthesis Example IV was repeated to produce 5.5 g of Resin (II). It was found to be about 30,000 in weight average molecular weight.

SYNTHESIS EXAMPLE XV

Using 9.8 g of the monomer (II-2) obtain in Synthesis Example II and 0.3 g of methacrylic acid, the procedure of Synthesis Example IV was repeated to produce 5.9 g of Resin (XII). It was found to be about 28,000 in weight average molecular weight.

SYNTHESIS EXAMPLE XVI

Using 9.8 g of the monomer (II-2) obtained in Synthesis Example II and 0.2 g of methacrylic acid, the procedure of Synthesis Example IV was repeated to produce 5.5 g of Resin (XIII). It was found to be about 33,000 in weight average molecular weight.

SYNTHESIS EXAMPLE XVII

Using 9.8 g of the monomer (II-2) obtained in Synthesis Example II and (0.2 g of methacrylic acid in the presence of 0.02 mol/l of AIBN, the procedure of Synthesis Example IV was repeated to produce 5.1 g of Resin (XIV). It was found to be about 24,000 in weight average molecular weight.

SYNTHESIS EXAMPLE XVIII

Using 9.8 g of the monomer (II-2) obtained in Synthesis Example II and 0.2 g of methacrylic acid in the presence of 0.03 mol/l of AIBN, the procedure of Synthesis Example IV was repeated to produce 5.1 g of Resin (XV). It was found to be about 18,000 in weight average molecular weight.

SYNTHESIS EXAMPLE XIX

Using 9.8 g of the monomer (II-2) obtained in Synthesis Example II, 0.3 g of methacrylic acid and 0.6 g of methyl methacrylate, the procedure of Synthesis Example IV was repeated to produce 5.9 g of Resin (XVI). It was found to be about 22,000 in weight average molecular weight.

Example I 100 weight parts of Resin (I) obtained in Synthesis Example IV and 2.0 weight parts of triphenylsulfonium triflate were dissolved in 300 weight parts of ethyl lactate and filtered through a teflon filter with a pore size of 0.1, to give a resist solution. It was spin-coated on a commonly washed silicon wafer, to form a uniform film 0.8 $\mu$m thick. The silicon wafer was baked at 90° C. for 90 sec and exposed through a mask to uv light of 248 nm in a KrF excimer laser steper. After this radiation, the wafer was thermally treated at 100° C. for 50 sec and developed in an aqueous 2.38 wt % tetramethylammonium hydroxide solution for 40 sec, to form a pattern. It was found to have a good cross section 0.45 $\mu$m thick at an exposure energy of 22 mJ/cm$^2$ as observed with an electron microscope.

Example II

A similar procedure to that of Example I was repeated except that a resist solution was prepared by dissolving 100 weight parts of Resin (II) obtained in Synthesis Example V and 2.2 weight parts of triphenylsulfonium triflate in 300 weight parts of ethyl lactate and the post-baking was carried out at 100° C. for 60 sec. The pattern obtained was found to have a good cross section 0.42 $\mu$m thick at an exposure energy of 18 mJ/cm$^2$ as observed with an electron microscope.

Example III

A similar procedure to that of Example I was repeated except that a resist solution was prepared by dissolving 100 weight parts of Resin (III) obtained in Synthesis Example VI and 2.5 weight parts of triphenylsulfonium triflate in 300 weight parts of ethyl lactate and the post-baking was carried out at 105° C. for 60 sec. The pattern obtained was found to have a good cross section 0.45 $\mu$m thick at an exposure energy of 20 mJ/cm$^2$ as observed with an electron microscope.

Example IV

A similar procedure to that of Example I was repeated except that a resist solution was prepared by dissolving 100 weight parts of Resin (XII) obtained in Synthesis Example XV and 3.0 weight parts of triphenylsulfonium triflate in 300 weight parts of ethyl lactate and the post-baking was carried out at 100° C. for 30 sec and the development for 20 sec in an aqueous 2.38 wt % tetramethylammonium hydroxide solution. The pattern obtained was found to have a good cross section 0.40 $\mu$m thick at an exposure energy of 15 mJ/cm$^2$ as observed with an electron microscope.

Example V

A similar procedure to that of Example I was repeated except for preparing a resist solution by dissolution of 100 weight parts of Resin (XIII) obtained in Synthesis Example XVI and 3.0 weight parts of triphenylsulfonium triflate in 300 weight parts of ethyl lactate and carrying out the post-baking at 110° C. for 30 sec and the development for 40 sec in an aqueous 2.38 wt % tetramethylammonium hydroxide solution. The pattern obtained was found to have a good cross section 0.40 $\mu$m thick at an exposure energy of 15 mJ/cm$^2$ as observed with an electron microscope.

Example VI

A similar procedure to that of Example I was repeated except for preparing a resist solution by dissolution of 100 weight parts of Resin (XIV) obtained in Synthesis Example XVII and 3.0 weight parts of triphenylsulfonium triflate in 300 weight parts of ethyl lactate and carrying out the post-baking at 110° C. for 30 sec and the development for 40 sec in an aqueous 2.38 wt % tetramethylammonium hydroxide solution. The pattern obtained was found to have a good cross section 0.40 $\mu$m thick at an exposure energy of 15 mJ/cm$^2$ as observed with an electron microscope.

Example VII

A similar procedure to that of Example I was repeated except for preparing a resist solution by dissolution of 100 weight parts of Resin (XV) obtained in Synthesis Example XVIII and 3.5 weight parts of triphenylsulfonium triflate in 300 weight parts of ethyl lactate and carrying out the post-baking at 100° C. for 50 sec and the development for 60 sec in an aqueous 2.38 wt % tetramethylammonium hydroxide solution. The pattern obtained was found to have a good cross section 0.35 $\mu$m thick at an exposure energy of 10 mJ/cm$^2$ as observed with an electron microscope.

Example VIII

A similar procedure to that of Example I was repeated except for preparing a resist solution by dissolution of 100 weight parts of Resin (XVI) obtained in Synthesis Example XIX and 3.5 weight parts of triphenylsulfonium triflate in 300 weight parts of ethyl lactate and carrying out the post-baking at 100° C. for 50 sec and the development for 60 sec in an aqueous 2.38 wt % tetramethylammonium hydroxide solution. The pattern obtained was found to have a good cross section 0.35 $\mu$m thick at an exposure energy of 15 mJ/cm$^2$ as observed with an electron microscope.

Example IX

A similar procedure to that of Example I was repeated except for using 2.0 weight parts of triphenylsulfonium hexafluoroantimonate instead of triphenylsulfonium triflate. The pattern obtained was found to have a good cross section 0.40 $\mu$m thick at an exposure energy of 20 mJ/cm$^2$ as observed with an electron microscope.

As described hereinbefore, the present invention is a polymer which can be sensitive to uv light, deep uv light, excimer laser, X-ray and electron base on the positive chemical amplified photoresist composition based on the polymer, which is superior in thermal resistance, resolution and storage preservativity and can afford resist patterns of excellent profile irrespective of the substrates employed.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A polymer having a repeating unit represented by the following formula (I):

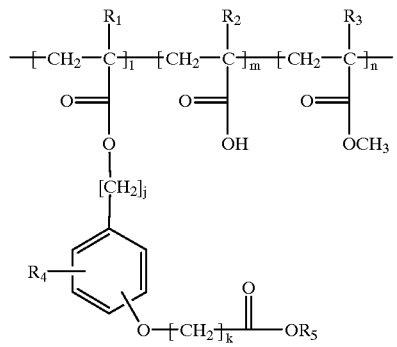

wherein, $R_1$, $R_2$, and $R_3$ are independently selected from the group consisting of a hydrogen atom and a methyl group; $R_4$ is selected from the group consisting of a hydrogen atom, an alkyl group and an alkoxy group; $R_5$ functions as an acid-labile protective group and is selected from the group consisting of a t-butyl group, a tetrahydropyranyl group and an alkoxymethylene group; j is an integer of 1–8; k is an integer of 0–8; and l, m and n each represent a mole ratio satisfying the condition of "l+m+n=1" where 0<l<0.4, the polymer having a styrene-reduced weight average molecular weight of 2,000 to 1,000,000.

2. A positive chemical amplified photoresist composition, comprising as a matrix resin a polymer with a polystyrene-reduced weight average molecular weight of 2,000 to 1,000,000, having the repeating unit represented by the following formula (I):

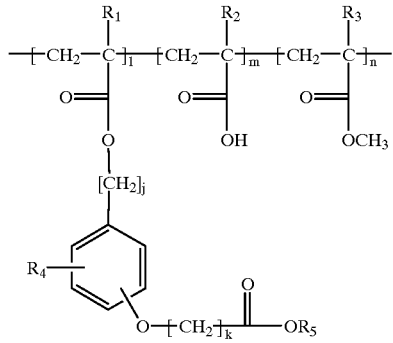

wherein $R_1$, $R_2$ and $R_3$ are independently selected from the group consisting of a hydrogen atom and a methyl group; $R_4$ is selected from the group consisting of a hydrogen atom, an alkyl group and an alkoxy group; $R_5$ functions as an acid-labile protective group and is selected from the group consisting of a t-butyl group, a tetrahydropyranyl group and an alkoxymethylene group; j is an integer of 1–8; k is an integer of 0–8; and l, m and n each represent a mole ratio satisfying the condition of "l+m+n=1" where 0<l<0.4; and a photoacid generator.

3. A positive chemical amplified photoresist composition in accordance with claim 2, wherein said photoacid generator is selected from the group consisting of bis(cyclohexylsulfonyl)diazomethane, bis(2,4-dimethylphenylsulfonyl)diazomethane, pyrogallol trimethylate, bis(4-t-butylphenyl)iodonium triflate, triphenylsulfonium triflate, diphenyl(4-t-butylphenyl)sulfonium triflate, diphenyl(4-methoxyphenyl)sulfonium triflate, diphenyl(4-methylphenyl)sulfonium triflate, and the mixtures thereof.

4. A positive chemical amplified photoresist composition in accordance with claim 2, wherein said photoacid generator is used at an amount of 0.1–30 weight parts per 100 weight parts of said polymer.

* * * * *